(12) United States Patent
Fukudome et al.

(10) Patent No.: US 7,518,160 B2
(45) Date of Patent: Apr. 14, 2009

(54) WAVELENGTH CONVERTER, LIGHTING SYSTEM, AND LIGHTING SYSTEM ASSEMBLY

(75) Inventors: Masato Fukudome, Kirishima (JP); Fujito Nakakawaji, Kirishima (JP); Masanobu Ishida, Kirishima (JP); Tsutae Iryou, Kirishima (JP)

(73) Assignee: Kyocera Corporation, Kyoto (JP)

( * ) Notice: Subject to any disclaimer, the term of this patent is extended or adjusted under 35 U.S.C. 154(b) by 29 days.

(21) Appl. No.: 11/554,393

(22) Filed: Oct. 30, 2006

(65) Prior Publication Data

US 2007/0096128 A1    May 3, 2007

(30) Foreign Application Priority Data

Oct. 31, 2005   (JP)   ............... 2005-316809

(51) Int. Cl.
*H01L 33/00* (2006.01)
(52) U.S. Cl. ................... 257/98; 257/E33.061
(58) Field of Classification Search .......... 257/79, 257/88, 94, 95, 96, 97, 98, 99, 100, 103, 257/E33.06, E33.061
See application file for complete search history.

(56) References Cited

U.S. PATENT DOCUMENTS 4,275,333 A * 6/1981 Kagami et al. .............. 313/495

| 2003/0030368 A1* | 2/2003 | Ellens et al. ............. 313/503 |
| 2004/0173808 A1* | 9/2004 | Wu .............................. 257/99 |
| 2006/0226772 A1* | 10/2006 | Tan et al. ................... 313/512 |

FOREIGN PATENT DOCUMENTS

| JP | 2927279 | 5/1999 |
| JP | 11-261114 | 9/1999 |
| JP | 2002-314142 | 10/2002 |
| JP | 2004-071908 | 3/2004 |
| WO | WO 99/50916 | 10/1999 |

OTHER PUBLICATIONS

R.N. Bhargava et al., "Optical Properties of Manganese-Doped Nanocrystals of ZnS", the American Physical Society, pp. 416-419, 1994.

* cited by examiner

*Primary Examiner*—Evan Pert
*Assistant Examiner*—Kevin Quinto
(74) *Attorney, Agent, or Firm*—Hogan & Hartson LLP

(57) ABSTRACT

In a wavelength converter converting a wavelength of light emitted from a light source and outputting an output light containing light whose wavelength is converted, which comprises a fluorescent substance dispersed in a transparent matrix, the fluorescent substance has semiconductor fine particles containing at least one univalent metal element selected from alkali metal and Ag, an element of group III in the periodic table selected from indium and gallium, and sulfur, and does not substantially contain Cd and Se. Hence, a wavelength converter having a conversion efficiency of equal to or more than that of a converter containing CdSe can be provided by using a semiconductor material formed of a highly safe composition.

18 Claims, 3 Drawing Sheets

WAVELENGTH CONVERTER, LIGHTING SYSTEM, AND LIGHTING SYSTEM ASSEMBLY

Priority is claimed to Japanese Patent Application No. 2005-316809 filed on Oct. 31, 2005, the disclosure of which is incorporated by reference in its entirety.

BACKGROUND OF THE INVENTION

1. Field of the Invention

The present invention relates to a wavelength converter with a fluorescent substance having semiconductor fine particles dispersed in a matrix, a lighting system in which the light emitted from a light emitting diode is subjected to wavelength conversion in a wavelength converter and taken out to the exterior, and a lighting system assembly provided with a plurality of the lighting systems. In particular, the present invention relates to a wavelength converter for lighting, and a lighting system which are suitably used in a backlight power source for an electronic display, or a fluorescent lamp, and the like.

2. Description of Related Art

A light emitting diode formed of a semiconductor material (hereinafter referred to as an "LED chip" in some cases) is small, has high power efficiency, and clearly develops colors. The LED chip has excellent characteristics of a long product life, high resistance to repetition of on/off lighting, and low power consumption. It is therefore anticipated that the LED chip will be applied to light sources for lighting such as a backlight light source of a liquid crystal or the like, and fluorescent lamps.

In the application of the LED chip to a light emitting unit, there has already been manufactured a light emitting unit emitting a color different from that of the light of the LED, in which part of the light of the LED chip is subjected to wavelength conversion with a fluorescent substance, and the light thus converted and light not subjected to wavelength conversion are mixed and emitted.

Specifically, there has been proposed, in order to emit white light, a light emitting unit provided with a wavelength converter including a fluorescent substance disposed on the surface of the LED chip. For example, in a light emitting unit in which a wavelength converter including a YAG fluorescent substance expressed by a composition formula of $(Y, Gd)_3 (Al, Ga)_5 O_{12}$ is formed on a blue LED chip using an n-type GaN material, a blue light is emitted from the LED chip, and part of the blue light is changed to yellow light by the wavelength converter. Therefore, there has been proposed a light emitting unit in which the blue light and the yellow light are mixed to form white light (refer to Japanese Patent No. 2927279 and Japanese Unexamined Patent Publication No. 11-261114).

An example of the light emitting unit so constructed is shown in FIG. 4. In FIG. 4, a light emitting unit has, on a substrate 102 with an electrode 101 formed thereover, a light emitting diode 103 including a semiconductor material which emits light with a center wavelength of 470 nm, and a wavelength converter 104 disposed so as to cover the light emitting diode 103. The wavelength converter 104 contains a fluorescent substance 105. As required, the side surfaces of the light emitting diode 103 and the wavelength converter 104 may be provided with a reflector 106 reflecting light in order that the light escaping from the side surfaces can be collected to the front so as to enhance the intensity of an output light.

In this light emitting unit, when the light emitted from the light emitting diode 103 is irradiated to the fluorescent substance 105, the fluorescent substance 105 is excited to emit visible light, and this visible light is used as output. However, when the brightness of the light emitting diode 103 is changed, the ratio of quantity of light of blue to yellow is changed and hence the tone of white is changed, resulting in poor color rendering property.

In order to solve this problem, it has been proposed to emit white light by converting purple light to the wavelengths of red, green, and blue, respectively. That is, as shown in FIG. 5, a purple LED chip having a peak of 400 nm or less is used as a light emitting diode 103, and a structure that three fluorescent substances 115, 116, and 117 are mixed in polymer resin is employed as a wavelength converter 104 (refer to Japanese Unexamined Patent Publication No. 2002-314142). This enables the color rendering property to be improved.

Nevertheless, in the light emitting unit as described in the publication No. 2002-314142, the luminous efficiency of red component fluorescent substance (for example, $Y_2O_3S:Eu$, or the like) with respect to an ultraviolet region in the vicinity of 400 nm of excited light is considerably lower than the other fluorescent substances, failing to achieve white light offering a good luminous balance of red, green, and blue.

To overcome this, when the amount of blending of the red fluorescent substance having low luminous efficiency is increased, the red fluorescent substance reabsorbs the fluorescence emitted from the green and blue fluorescent substances. Hence, the amounts of emission of the green and blue fluorescent substances become lessened, failing to improve the luminous efficiency of the white light emitting unit. Although the luminous efficiency can also be improved by increasing the amount of blending of the green and blue fluorescent substances having high luminous efficiency, it is impossible to obtain white light offering a good luminous balance of red, green, and blue.

Consequently, there has been a demand for a photoluminescence fluorescent substance having high fluorescent quantum efficiency in a wide wavelength region from blue to red. As means for fulfilling this demand, for example, Japanese Unexamined Patent Publications No. 2004-71908 and W O 1999/050916(JP 2002-510866 A1) have proposed to form a photoluminescence fluorescent substance into nano-particles. Further, Bhargava et al reported in 1994 that, when the radii of particles are Bohr radius or less, the fluorescent quantum efficiency of a doped fluorescent substance is increased [refer to R. N. Bhargava et al, "Optical Properties of Manganese-Doped Nanocrystals of ZnS," Phys. Rev. Lett. 72, 416 (1994)].

After this was reported, various considerations of the luminous characteristics of nano-particles have been made. As described in the above-mentioned publications No. 2004-71908 and W O 1999/050916, the representative example is to increase the luminous efficiency by utilizing quantum size effect to be developed by forming the photoluminescence fluorescent substance into nano-particles. Specifically, without changing any composition, the luminous efficiency can be increased by changing the particle diameter of the photoluminescence fluorescent substance from a several μm as has been conventional, to 0.1 nm to 100 nm.

However, the embodiment of WO1999/050916 discloses only one case where cadmium selenide (CdSe) is used in a core, as a photoluminescence fluorescent substance composition.

Although CdSe has a band gap of about 2 eV and can change the particle diameter to change the fluorescent wavelength, it has a strong toxicity that may raise questions of industry and environment. Also in the specifications of the above-mentioned publications No. 2004-71908 and WO 1999/050916, ZnS and the like are disclosed as an example of the fluorescent substance for which neither Cd nor Se is essential. However, this poses a problem that the fluorescent substance formed of such a composition cannot achieve such a luminous efficiency as high as CdSe.

SUMMARY OF THE INVENTION

The present invention aims at providing a wavelength converter exhibiting a conversion efficiency of equal to or more than that of a converter containing CdSe by using a semiconductor material formed of a highly safe composition, instead of toxic CdSe or the like, as well as a lighting system using the wavelength converter, and a lighting system assembly provided with a plurality of the lighting systems.

According to the present invention, there is provided a wavelength converter with a fluorescent substance dispersed in a transparent matrix. The wavelength converter converts a wavelength of light emitted from a light source and outputs an output light containing light whose wavelength is converted. The fluorescent substance has semiconductor fine particles containing at least one univalent metal element selected from alkali metal and Ag, a member of group III in the periodic table, and sulfur, and not substantially containing Cd and Se.

Preferably, the semiconductor fine particles further include zinc, or are formed of a $Zn_\alpha Ag_\beta InS_\gamma$ compound ($\alpha$=0.1 to 1, $\beta$=0.1 to 1, and $\gamma$=2 to 4).

This requires no raw material having high damaging potential, so that a highly safe wavelength converter can be achieved with a highly safe semiconductor material. Because of high stability of the univalent metal element, the impurity level between bands can be lowered to achieve extremely high quantum efficiency. As the result, the wavelength converter having a conversion efficiency of equal to or more than that of a converter containing CdSe can be provided without using CdSe.

Preferably, the surfaces of the semiconductor fine particles are coated with a semiconductor material having a larger band gap than the semiconductor fine particles, or coated with surface modifying molecules formed of an organic compound. It is further preferred that a semiconductor material having a larger band gap than the semiconductor fine particles, and surface modifying molecules formed of an organic compound are sequentially layered on the surfaces of the semiconductor fine particles. Preferably, the surface modifying molecules are molecules having repetitively two or more silicon-oxygen bondings.

This enables to reduce defects existing in the surface of the semiconductor fine particles, and increase the quantum confinement effect of the semiconductor fine particles, thereby improving the quantum efficiency of the fluorescent substance. Further, the fluorescent substance can be dispersed more uniformly by coating the surfaces of the semiconductor fine particles with predetermined modifying molecules. Furthermore, the dispersibility of the fluorescent substance to polymer resin, such as silicone polymer resin can be improved to achieve the wavelength converter outputting light of less nonuniformity. Additionally, in the molecules having repetitively two or more silicon-oxygen bondings, the bonding at the corresponding portions has a higher silicon-oxygen bonding strength than carbon-carbon bonding, and hence they are less susceptible to decomposition due to light and heat. This results in the wavelength converter having superior light resistance, heat resistance, and transparency. Moreover, the molecules having repetitively two or more silicon-oxygen bondings have water repellency, enabling the fluorescent substance to be protected against deterioration due to water.

Preferably, the semiconductor fine particles have a mean particle diameter of 0.5 to 10 nm, or two or more kinds of fluorescent substances with the semiconductor fine particles having different mean particle diameters are dispersed.

This realizes a fluorescent substance (semiconductor ultrafine particles) having high fluorescent efficiency. By dispersing the fluorescent substance in the wavelength converter, a wavelength converter having extremely high conversion efficiency can be obtained. By dispersing in a wavelength converter two or more kinds of fluorescent substances with the semiconductor fine particles having different mean particle diameters, it is capable of converting into a plurality of lights of wavelengths, enabling to cover a wide wavelength range. Therefore, by using this wavelength converter, a light emitting unit having superior color rendering property can be achieved.

Preferably, the output light has a peak wavelength of 400 to 750 nm. This enables to cover a wide wavelength range, thus improving color rendering property.

Preferably, the wavelength converter has a thickness of 0.1 to 5 mm. This enables the fluorescent substance to improve wavelength conversion efficiency, and suppress the converted light from being absorbed by another fluorescent substance.

According to the present invention, there is provided a lighting system having, on a substrate, a light emitting diode formed of a compound semiconductor emitting excited light, and the wavelength converter converting a wavelength of the excited light. Preferably, the band gap energy of at least part of semiconductor fine particles included in the fluorescent substance of the wavelength converter is smaller than an energy emitted from the light emitting diode.

The presence of the above-described wavelength converter enables a lighting system exhibiting high safety, color rendering property, and luminous efficiency. By setting the band gap energy of at least part of the semiconductor fine particles to be smaller than the energy emitted from the light emitting diode, the energy emitted from the light emitting diode can be absorbed efficiently by the semiconductor fine particles, permitting a further improvement in the luminous efficiency of the light emitting unit.

According to the present invention, there is provided a lighting system assembly having a plurality of the lighting systems. Thus, the lighting system assembly exhibiting high safety, color rendering property, and luminous efficiency can be achieved. This realizes the lighting system assembly being extremely bright and power saving, which may substitute for conventional fluorescent lamps.

Other objects and advantages of the present invention will become more apparent from the following detailed description of the present invention when taken in conjunction with the accompanying drawings.

DESCRIPTION OF PREFERRED EMBODIMENTS

<Light Emitting Unit>

Figure 1:
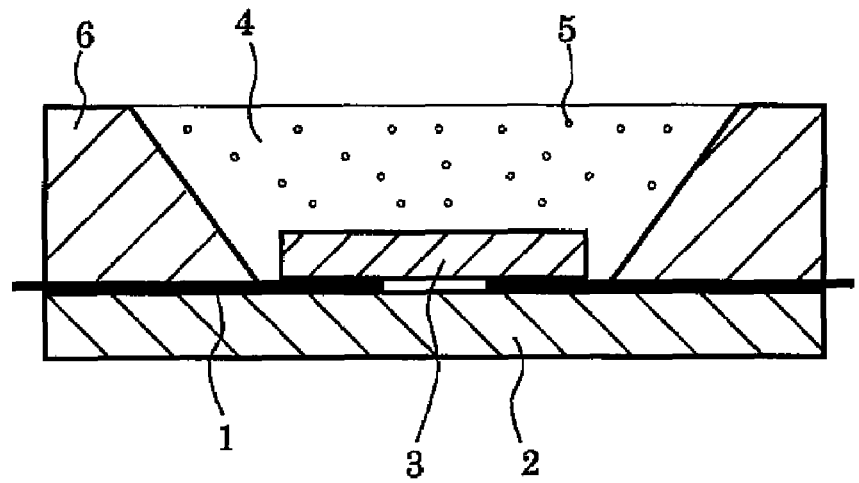
FIG. 1 is a schematic sectional view illustrating a preferred embodiment of a wavelength converter and a light emitting unit according to the present invention.

Wavelength converters and light emitting units of the present invention will be described below with reference to the accompanying drawings. FIG. 1 is a schematic sectional view illustrating a preferred embodiment of a light emitting unit of the present invention. This light emitting unit has, on a substrate 2, a light emitting diode 3 formed of a compound semiconductor emitting excited light, a conductor 1 electrically connected to the light emitting diode 3 and allowing it to be connected to the exterior, and a wavelength converter 4 converting the wavelength of the excited light. The wavelength converter 4 includes a fluorescent substance 5 dispersed in a transparent matrix, and converts the wavelength of the light emitted from the light emitting diode 3 as a light source, and then outputs an output light containing the light whose wavelength has been converted. The light emitting unit of FIG. 1 is further provided with a reflector 6.

Figure 2:
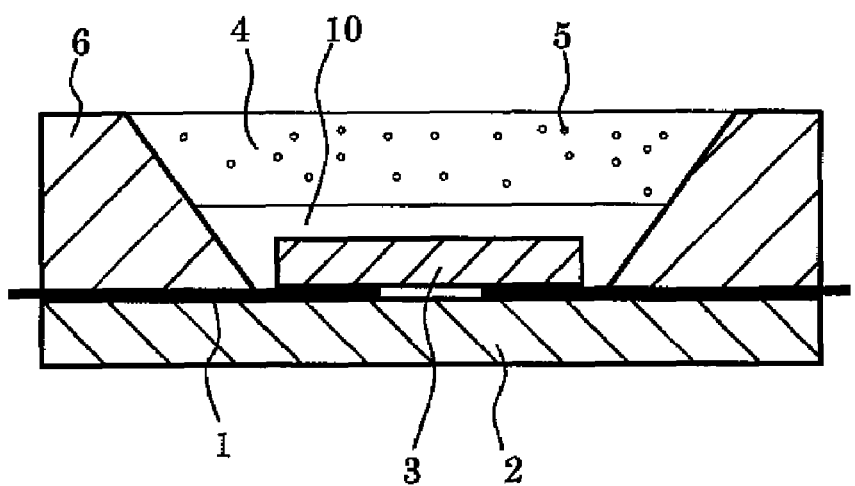
FIG. 2 is a schematic sectional view illustrating another preferred embodiment of the wavelength converter and the light emitting unit according to the present invention.

FIG. 2 illustrates another preferred embodiment of the light emitting unit in the present invention. As illustrated in FIG. 2, an internal layer 10 coating the light emitting diode 3 may be provided. The internal layer 10 can be formed from, for example, the following transparent matrix, preferably silicone resin.

<Conductor>

The conductor 1 has a function as a conductive path for electrically connecting the light emitting diode 3, and is connected with a conductive connecting material to the light emitting diode 3. As the conductor 1, a metalized layer containing metal powder such as W, Mo, Cu, and Ag can be used. When the substrate 2 is formed of ceramics, the conductor 1 can be formed on the substrate 2 by sintering at high temperatures a metal paste in which a wiring conductor is formed of tungsten (W), molybdenum (Mo)-manganese (Mn), or the like. When the substrate 2 is formed of resin, a lead terminal formed of copper (CU), iron (Fe)-nickel (Ni) alloy, or the like is formed by molding, and disposed and fixed in the inside of the substrate 2.

<Substrate>

The substrate 2 is required to have superior thermal conductivity and a high total reflection rate. Therefore, polymer resin in which metal oxide fine particles are dispersed can be used suitably, besides ceramic materials such as alumina, aluminium nitride, or the like.

<Light Emitting Diode>

As the light emitting diode 3, a light emitting diode including a semiconductor material emitting light, the center wavelength of which is 450 nm or less, can be used to achieve efficient excitation of the fluorescent substance.

It is greatly preferred to emit light of 380 to 420 nm. This increases the intensity of an output light so as to achieve a lighting system of higher luminous intensity.

Preferably, the light emitting diode 3 emits the above-mentioned center wavelength, and has, on the surface of a light emitting diode substrate, a structure including a luminescent layer formed of a semiconductor material (not shown), in the interest of high external quantum efficiency. As this semiconductor material, there can be used various semiconductors such as ZnSe and nitride semiconductors (GaN, etc.). No particular limitation is imposed on the kind of the semiconductor material as long as its emission wavelength falls within the above-mentioned wavelength range. With a crystal growth method such as metal organic chemical vapor deposition (MOCVD) method or molecular beam epitaxial growth method, the above semiconductor material may be used to form a laminate structure having a luminescent layer formed of the semiconductor material on the light emitting diode substrate. When a luminescent layer formed of nitride semiconductor is formed on the surface, sapphire, spinel, SiC, Si, ZnO, $ZrB_2$, GaN, quartz, or the like can be used suitably in order to form nitride semiconductors of superior crystallinity at high quantity production property.

Preferably, the band gap energy of at least part of the fluorescent substance 5 included in the wavelength converter 4 is smaller than the energy emitted from the light emitting diode 3. This enables the fluorescent substance 5 to absorb efficiently the energy emitted from the light emitting diode 3, thereby improving the luminous efficiency.

<Reflector>

As required, the side surfaces of the light emitting diode 3 and the wavelength converter 4 may be provided with the reflector 6 reflecting light, so that the light escaping from the side surfaces can be reflected to the front thereby to enhance the intensity of an output light. Examples of the material of the reflector 6 are aluminium (Al), nickel (Ni), silver (Ag), chrome (Cr), titanium (Ti), copper (Cu), gold (Au), iron (Fe), laminate structures of these, alloys of these, ceramics such as alumina ceramics, and resins such as epoxy resin.

<Wavelength Converter>

The wavelength converter 4 incorporates a fluorescent substance 5 having semiconductor fine particles in a transparent matrix. The fluorescent substance 5 can be directly excited by the light emitted from the light emitting diode 3, and emit visible light as a converted light. The light so converted by the fluorescent substance 5 in the wavelength converter 4 is then synthesized and taken out as an output light.

The wavelength converter 4 has a thickness of 0.1 to 5.0 mm, preferably 0.2 to 1 mm, in the interest of conversion efficiency. When using the fluorescent substance 5 having a mean particle diameter of 0.5 to 10 μm, it is desirable to set the thickness of the wavelength converter 4 to 0.3 to 1.0 mm. When the fluorescent substance 5 (the fluorescent substance 5 including semiconductor ultrafine particles) has a particle diameter of 20 nm or less, it is desirable to set the thickness of the wavelength converter 4 to 0.1 to 1 mm, especially 0.1 to 0.5 mm. By setting the thickness in the above-mentioned range, the wavelength conversion efficiency of the wavelength converter 4 can be improved to suppress the converted light from being absorbed by another fluorescent substance. It is therefore capable of converting the light emitted from the light emitting diode 3 to visible light at high efficiency, and also enabling the converted visible light to be transmitted to the exterior at high efficiency.

Preferably, the peak wavelength of the output light from the wavelength converter 4 is 400 to 750 nm, especially 450 to 650 nm. This enables emission wavelength to be covered over a wide range, thereby improving color rendering property.

The wavelength converter 4 may contain a plurality of kinds of fluorescent substances 5, each of which is directly excited by the light emitted from the light emitting diode 3. The wavelengths of these lights are synthesized to cover the emission wavelength over a wide range, enabling the color rendering property to be improved significantly. The peak wavelength of the visible light so obtained is 400 to 750 nm, particularly 450 to 700 nm, more particularly 500 to 650 nm.

Preferably, the wavelength converter 4 emits fluorescence having two or more intensity peaks in the wavelength range of visible light, in order to cover the emission wavelength over a wide range, and further improve the color rendering property. Preferably, the wavelength converter 4 contains, for example, a plurality of fluorescent substances 5 having different converted wavelengths, and the converted wavelengths are wavelengths corresponding to blue, green, yellow, and red, respectively.

<Transparent Matrix>

In order to uniformly disperse and carry the fluorescent substances 5, and suppress the optical degradation of the fluorescent substances 5, it is desirable to form the wavelength converter 4 by dispersing the fluorescent substances 5 in a transparent matrix formed of polymer resin, a glass material, or the like. It is desirable that a polymer resin film and the glass material of sol-gel glass thin films have high transparency and such durability as may not to be easily discolored by heat and light.

No particular limitation is imposed on the material of the polymer resin film. There can be used, for example, epoxy resin, silicone resin, polyethylene telephthalate, polybutylene telephthalate, polyethylene naphthalate, polycarbonate, polyether sulphone, cellulose acetate, polyarylate, and derivatives of these. It is highly desirable to have excellent light transmittivity in a wavelength range of 350 nm or more. From the viewpoint of heat resistance in addition to the light transmittivity, silicone resin can be used more suitably.

Examples of the glass material are silica, titania, zirconia, and composites of these. The fluorescent substances 5 are individually dispersed in the glass material. The glass material has higher durability to light, particularly ultraviolet light, and also higher durability to heat than the polymer resin film, enabling the product life to be elongated. Additionally, the glass material can improve stability thereby to achieve the light emitting system having superior reliability.

<Fluorescent Substances>

The fluorescent substances 5 used in the present invention include semiconductor fine particles containing at least one univalent metal element selected from alkali metal and Ag, a member of group III in the periodic table such as indium or gallium, and sulfur, or semiconductor fine particles further containing zinc in addition to these. Hence, the wavelength converter 4 having high safety can be achieved with the semiconductor material formed of the composition having high safety, without requiring any raw material having high damaging potential such as Cd and Se. Further, because of the high stability of the univalent metal element, the impurity level between bands in the obtained semiconductor fine particles can be lowered than when used other metal material, thereby achieving extremely high quantum efficiency. Consequently, the excited light from the light emitting diode 3 can be converted efficiently to achieve the wavelength converter having a conversion efficiency of equal to or more than that of a converter containing CdSe.

In the present invention, preferably, two or more kinds of fluorescent substances 5 with semiconductor fine particles having different mean particle diameters are used as the fluorescent substance 5. With this constitution, when the two or more kinds of semiconductor fine particles having different mean particle diameters are dispersed and mixed in the wavelength converter 4, they can be converted to a plurality of wavelengths' lights in the wavelength converter 4, Hence, a wide wavelength range can be covered to provide a light emitting unit having superior color rendering property.

Preferably, the semiconductor fine particles are semiconductor ultrafine particles having a mean particle diameter of 0.5 to 10 nm. Setting the mean particle diameter to 0.5 nm or more can suppress fluorescence efficiency from lowering due to the influence of surface defects of the semiconductor ultrafine particles, It is therefore capable of obtaining the semiconductor ultrafine particles and the fluorescent substances 5 each having high fluorescence efficiency. Setting the mean particle diameter to 10 nm or less enables light absorption and emission to be repeated quickly. This results in the semiconductor ultrafine particles and fluorescent substances 5 each having high fluorescence efficiency. The above-mentioned ultrafine particles also have the following characteristic features. That is, they can exhibit various emissions from red (longer wavelength) to blue (shorter wavelength) by changing a size of the particles. If they have a higher energy than the band gap (forbidden band width), no limitation is imposed on excitation wavelength. Their luminescence lifetime is about one hundred thousandth that of rare earth elements, and the cycle of absorption and emission can be repeated quickly to permit extremely high brightness, resulting in less degradation than an organic dye (The photon number taken out as fluorescence until degradation seems to be one hundred thousand times that of the dye). Accordingly, the use of the semiconductor ultrafine particles enables to achieve the wavelength converter 4 and the light emitting unit each having superior luminous efficiency and a long life. That is, in the wavelength converter 4, the fluorescent substances 5 may be a combination of fluorescent substances with the semiconductor fine particles having different converted wavelengths.

The surfaces of the semiconductor fine particles may be coated with a semiconductor material having a larger band gap than the semiconductor fine particles. With this constitution, the defects existing in the surfaces of the semiconductor fine particles can be reduced to increase the quantum confinement effect of the semiconductor fine particles. As the result, the quantum efficiency of the semiconductor fine particles can be increased to achieve the wavelength converter 4 having superior conversion efficiency. In the present invention, examples of the semiconductor material used for coating are ZnS, ZnO, MgS, GaN, GaP, and the like.

As an example of coating the surfaces of the semiconductor fine particles with a semiconductor material having a larger band gap than the semiconductor fine particles, there is a so-called core shell structure consisting of a core and a shell. In some cases, the core shell type semiconductor ultrafine particles having this structure is suitable for application using exciton absorbing and emitting band. In this case, it is generally effective to form an energetic barrier by employing one having a larger band gap than the core, as a composition of semiconductor fine particles of the shell. It can be presumed that this is owing to a mechanism for suppressing the adverse effect of a surface level and the like due to the influence of the outside, the crystal lattice defect on the crystal surface, or the like. As a composition of a semiconductor material to be used suitable for the shell, though it depends on the band gap of a core semiconductor crystal, there are ones whose band gap in bulk state is 2.0 eV or more at a temperature of 300 K, such as ZnS, ZnO, MgS, GaN, and GaP.

The semiconductor fine particles may be coated with surface modifying molecules formed of an organic compound (for example, organic ligand). This coating with the surface modifying molecules can suppress degradation of characteristic due to aggregation of the particles. Specifically, the fluorescent substances 5 can be dispersed in spaced relation to each other, without causing the particles to be adjacent to each other due to the steric hindrance of the surface modifying molecules. This dispersion can suppress deterioration of characteristic due to the aggregation of the fluorescent substances 5, enabling the functions of the semiconductor fine particles and the fluorescent substances 5 to be maximized to achieve the wavelength converter 4 having superior conversion efficiency.

Examples of the surface modifying molecules are molecules having a hydrocarbon group containing an alkyl group with the number of carbons of about 3 to 20, such as n-propyl group, isopropyl group, n-butyl group, isobutyl-group, n-pentyl group, cycropentyl group, n-hexyl group, cycrohexyl group, octyl group, decyl group, dodecyl group, hexadecyl group, octadecyl, or the like; and an aromatic hydrocarbon group such as phenyl group, benzil group, naphthyl group, naphthylmethyl group, or the like. Among them, the molecules having a straight chain alkyl group with the number of carbons of about 6 to 16, such as n-hexyl group, octyl group, decyl group, dodecyl group, and hexadecyl group, are more preferred. Alternatively, a functional group containing sulfur atoms such as mercaptol group, disulfide group, thiophene ring, or the like; a functional group containing nitrogen atoms such as amino group, pyridine ring, amide bonding, nitril group, or the like; an acid functional group such as carboxyl group, sulphone acid group, phosphin acid group, or the like; a functional group containing phosphor atoms such as phosphine group, phosphine oxide group, or the like; or a functional group containing oxygen atoms such as hydroxy group, carbonyl group, ester bonding, ether bonding, polyethylene glycol chain, or the like, may be used as surface modifying molecules. These surface modifying molecules are suitably used in the interest of dispersion of the fluorescent substances 5 in spaced relation to each other without causing them to be adjacent to each other due to the steric hindrance of the surface modifying molecules.

Alternatively, as the surface modifying molecules, there may be used molecules having repeatedly two or more silicon-oxygen bondings, such as a silicone compound comprising mainly of silicon-oxygen bonding and has a functional group selected from amino group, carboxyl group, mercaptol, and hydroxy group. When using such surface modifying molecules, it is preferred that silicone resin comprising mainly of silicon-oxygen bonding is used as the transparent matrix, and the fluorescent substances 5 are dispersed in the silicone resin. With this constitution, the dispersibility of the fluorescent substances 5 to polymer resin such as silicone polymer resin can be increased to achieve the wavelength converter 4 exhibiting superior conversion efficiency, light resistance, heat resistance, and transparency.

Figure 3:
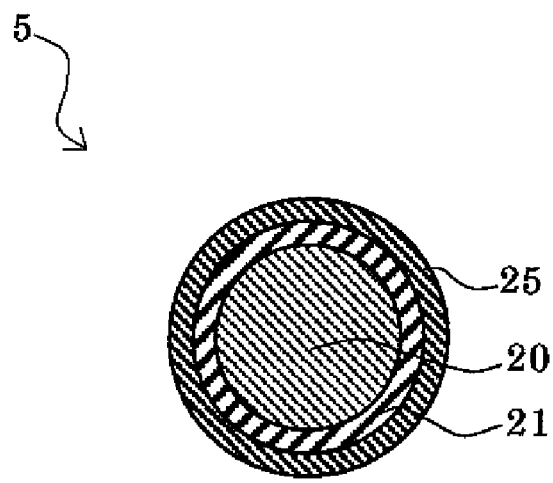
FIG. 3 is a schematic sectional view illustrating an example of a fluorescent substance used in the wavelength converter of the present invention.
Figure 4:
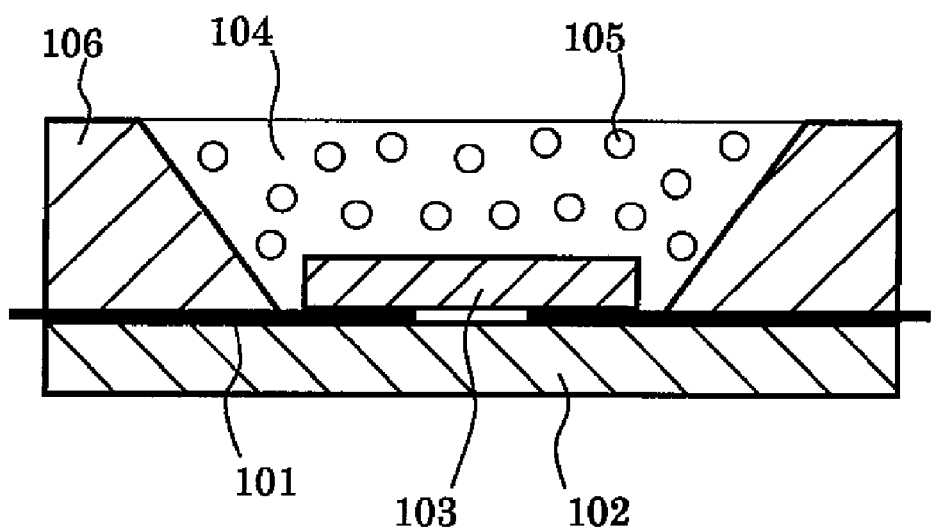
FIGS. 4 and 5 are schematic sectional views illustrating conventional light emitting units, respectively.
Figure 5:
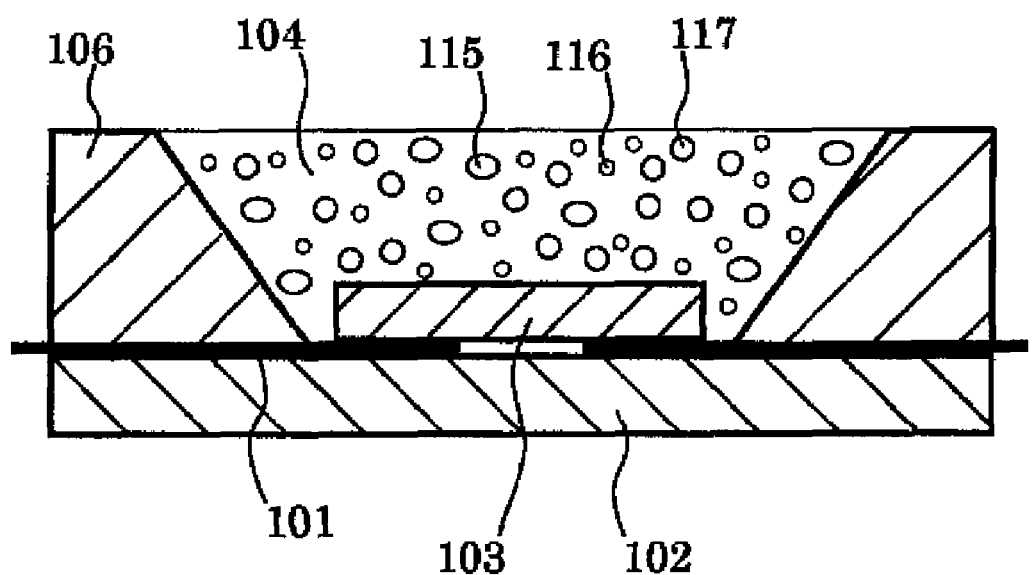

FIG. 3 illustrates an example of the constitution of the fluorescent substance 5 and semiconductor fine particles. As illustrated in FIG. 3, the fluorescent substance 5 includes semiconductor fine particles 20, and a semiconductor material 21 and surface modifying molecules 25 are layered in sequence on the surfaces of the semiconductor fine particles 20. Alternatively, the surfaces of the semiconductor fine particles 20 may be coated only with the semiconductor material 21 or the surface modifying molecules 25. It is however preferred that the surfaces of the semiconductor fine particles 20 be coated with both of the semiconductor material 21 and the surface modifying molecules 25. Preferably, the semiconductor material 21 and the surface modifying molecules 25 are layered in sequence as shown in FIG. 3.

<Manufacture of Semiconductor Fine Particles>

The semiconductor fine particles and the semiconductor ultrafine particles can be manufactured with, for example, the following manufacturing methods: vapor-phase chemical reaction method such as flame process, plasma process, electrical heating process, or laser process; or physical cooling method; or a liquid phase method such as sol-gel method, alkoxide method, coprecipitation method, hot soap method, hydrothermal synthesis method, or spray thermal decomposition method; or mechanochemical bonding method. It is preferred to employ hot soap method when manufacturing the semiconductor fine particles used in the present invention.

The measurement of mean particle diameter can be made by a method of measuring the mean particle diameter of semiconductor ultrafine particles (a yellow fluorescent substance 5a and a red fluorescent substance 5b) in the following examples to be described later.

<Manufacture of Wavelength Converter>

The wavelength converter 4 can be formed with coating method by using a glass material such as sol-gel glass film, or a polymer resin film. Although no particular limitation is imposed on general coating methods, the coating with a dispenser is preferred. For example, the wavelength converter 4 can be manufactured by blending the fluorescent substances 5 into liquid and uncured resin, a glass material, or a resin and glass material to which plasticity is imparted with solvent. For example, silicone resin can be used as the uncured resin. These resins may be of the type that two liquids are mixed and cured, or the type to be cured with one liquid. For the former type, the fluorescent substances 5 may be kneaded into the two liquids, respectively, or the fluorescent substances 5 may be kneaded into either one liquid. For example, acryl resin can be used as the resin to which plasticity is imparted with solvent.

The cured wavelength converted 4 can be obtained by forming in a film shape by employing a coating method such as a dispenser in an uncured state, or by casting and solidifying in a predetermined die. As a method of curing the resin and glass material, there is a method of volatilizing solvent, besides a method of employing thermal energy or optical energy.

<Manufacture of Light Emitting Unit>

The light emitting unit of the present invention can be achieved by disposing the wavelength converter 4 on the light emitting diode 3, as illustrated in FIGS. 1 and 2. As a method of disposing the wavelength converter 4 on the light emitting diode 3, the cured sheet-like wavelength converter 4 can be disposed on the light emitting diode 3. Alternatively, a liquid uncured material may be disposed on the light emitting diode 3, followed by curing.

<Lighting System Assembly>

The lighting system assembly of the present invention is provided with a plurality of the above-mentioned lighting systems. This results in the lighting system assembly exhibiting superior safety, color rendering property and luminous efficiency, that is, the extremely bright and power saving lighting system assembly. A suitable example is a lighting system assembly with a plurality of the lighting systems arranged on a flat surface.

EXAMPLES

The following examples illustrate the manner in which the present invention can be practiced. It is understood, however, that the examples are for the purpose of illustration and the invention is not to be regarded as limited to any of the specific materials or condition therein.

Example 1

<Manufacture of Semiconductor Ultrafine Particles>

Semiconductor ultrafine particles as shown in Table 1 were manufactured with hot soap method in the following manner. First, a predetermined amount of silver chloride (manufactured by KANTO CHEMICAL CO. INC.) and a predetermined amount of indium chloride (manufactured by KANTO CHEMICAL CO. INC.) are separately dissolved in oleyl amine. The respective solutions were then mixed to prepare a solution 1. Next, 7.6 g (0.1 M) of diethyldithio zinc carbamate (manufactured by KANTO CHEMICAL CO. INC.) was dissolved in a mixed solution of oleyl amine and trioctyl phosphine to prepare a solution 2. Adjustments to the solution 1 and the solution 2 were made in an atmosphere of nitrogen. The silver chloride and the indium chloride were added so as to be the ratio of blending (the mole ratio) as shown in Table 1.

The solution 1 and the solution 2 thus prepared in the above manner were mixed and allowed for reaction with stirring under conditions of the reaction temperature and the reaction time as shown in Table 1, thereby synthesizing semiconductor ultrafine particles ($Zn_\alpha Ag_\beta InS_\gamma$ compound ($\alpha$=0.1 to 1, $\beta$=0.1 to 1, and $\gamma$=2 to 4). The mean particle diameter of the semiconductor ultrafine particles was controlled by changing the ratio of blending (the molar ratio) of silver, indium, and sulfur, the reaction temperature, and the reaction time (refer to Table 1). At the completion of the reaction, this solution was cooled to room temperature. To the cooled solution, toluene was added and mixed uniformly, and further ethanol was added and subjected to acceleration of 1500 G for 10 minutes by a centrifugal so as to precipitate the semiconductor ultrafine particles.

The mean particle diameter of the semiconductor ultrafine particles (the yellow fluorescent substance 5a and the red fluorescent sunstance 5b) was determined on a transmission electron microscope (TEM). The results are presented in Table 1.

The used transmission electron microscope was JEM2010F manufactured by JEOL, and the observation of an accelerating voltage of 200 kV was performed in the following procedure. The semiconductor ultrafine particles precipitated in the above manner were collected in a sample bottle, and IPA and toluene were added and dispersed in such an amount as to fall within a particle concentration of 0.002 to 0.02 mol/liter. This was skimmed with a micro grid for TEM observation, and dried and set on the transmission electron microscope. The mean particle diameter was determined by confirming the particles in a lattice image. First, a region where the particles adhered to a mesh was found at a low magnification. At this time, in a region where a large number of the semiconductor ultrafine particles were adhered, the particles were stacked in the direction of an electron beam, and hence this region was unsuitable for the determination of mean particle diameter. The semiconductor ultrafine particles adhered to a Cu mesh portion in the micro grid were also unsuitable for the observation of the mean particle diameter because no lattice image could be observed. Therefore, the semiconductor ultrafine particles locating at a resin portion in the micro grid where the amount of overlapping was at a minimum was selected to determine its mean particle diameter. This portion was then magnified about 1,000,000 times in order to confirm the lattice image.

If a large amount of the organic component used at the time of synthesis remained around the semiconductor ultrafine particles, the lattice image was blurred, failing to determine accurately the mean particle diameter. In such a case, the location for observation was changed. In some cases, the observation was carried out with another sample prepared by repetitive removal of the organic component used at the time of synthesis.

The above-mentioned organic component can be removed by adding chloroform, toluene, or hexane to the precipitated semiconductor ultrafine particles, and dispersing by ultrasonic wave, and then adding alcohol (for example, ethanol) thereto, followed by centrifuging. This organic component was dissolved in the ethanol of the supernatant liquid, and the semiconductor ultrafine particles were precipitated. As required, this operation was repeated. Thus, the semiconductor ultrafine particles having less adhesion of the organic component used at the time of synthesis was sought out. Then, with this portion set at a magnification of 4,000,000 times, the photograph of a lattice image was taken. At this time, the photographing was performed quickly because the semiconductor ultrafine particles would move if the application of electron beam were continued for a long period of time.

Based on the diameters of 200 lattice images so taken, the mean particle diameter of the semiconductor ultrafine particles was found in the following manner.

A longitudinal mean particle diameter was calculated by statistically processing with a histogram the diameters of the measured lattice images. In this calculation method, the number of pieces belonging to a diameter area was counted, and the sum of the respective products of the central value and the number of pieces in the diameter area was divided by the total number of the measured lattice images [refer to Shape of Mean Particle diameter and Formula Thereof, "Manufacturing Process of Ceramic" p. 11-12, edited by Subcommittee of Ceramic Industry Association Editorial Committee Course, issued by Ceramic Industry Association (1984)]. The longitudinal mean particle diameter thus calculated was regarded as the mean particle diameter of the semiconductor ultrafine particles.

Comparative Example 1

Semiconductor ultrafine particles of cadmium selenide having a mean particle diameter of 2.9 nm were manufactured with hot soap method in the same manner as in Example 1.

A 7.9 g (0.1 M) of Se powder manufactured by KANTO CHEMICAL CO. INC. was dissolved in 250 g of trioctylphosphine (TOP) to obtain a solution 1. A 7.6 g (0.1 M) of sodium sulfide manufactured by KANTO CHEMICAL CO. INC. was dissolved in 250 g of trioctylphosphine (TOP) to obtain a solution 2.

Next, 5.3 g (0.02 M) of cadmium acetate and 100 g of stearic acid each being manufactured by KANTO CHEMICAL CO. INC. were mixed and dissolved at 130 degrees Celsius. To this solution, 400 g of trioctylphosphineoxide (TOPO) was added, and this was then heated and dissolved at 300 degrees Celsius.

To this solution, the solution 1 was added and reacted under condition of 300 degrees Celsius. At the completion of the reaction, this was cooled to room temperature. To the cooled solution, 200 g of toluene was added and mixed uniformly. Thereafter, ethanol was added and subjected to acceleration of 1500 G for 10 minutes by a centrifugal so as to precipitate cadmium selenide particles. To this cadmium selenide particles, 3.7 g (0.02 M) of zinc acetate and 100 g of stearic acid were added and dissolved at 130 degrees Celsius. To this solution, 400 g of trioctylphosphineoxide (TOPO) was added and heated at 300 degrees Celsius, and the solution 2 was added thereto and cooled to room temperature. After 200 g of toluene was added thereto and mixed uniformly, ethanol was added and subjected to acceleration of 1500 G for 10 minutes by the centrifugal so as to precipitate the cadmium selenide particles of a core shell structure whose surface was coated with zinc sulfide. This resulted in the semiconductor ultrafine particles of cadmium selenide.

Examples 2 to 12

<Formation of Core Shell Structure>

A core shell structure was formed by coating the surfaces of the above-mentioned semiconductor ultrafine particles of Example 1 with a semiconductor material [zinc sulfide (ZnS)] in the following manner. First, the semiconductor ultrafine particles obtained in the above-mentioned manner were added to a mixed solution of 1.1 g of zinc acetate, 9.9 mL of oleic acid, and 300 mL of octadecene, and stirred while heating at 170 degrees Celsius under argon flow for two hours. To this solution, 12 g of sulfur and 1.5 g of trioctylphosphine (TOP) were added and stirred at 300 degrees Celsius. At the completion of the reaction, this was cooled to room temperature. After 200 g of toluene was added thereto and mixed uniformly, ethanol was added and subjected to acceleration of 1500 G for 10 minutes by the centrifugal so as to precipitate the semiconductor ultrafine particles having the core shell structure, the surfaces of which were coated with zinc sulfide.

<Formation of Surface Modifying Molecules>

To 1 g of each of the semiconductor ultrafine particles of Example 1, the semiconductor ultrafine particles having the core shell structure (Examples 2 to 12), and the semiconductor ultrafine particles of Comparative Example 1, there was added 2 g of modified silicone in which an amino group was present at a functional group and a side chain substitutional group was methyl group. These were stirred while heating at 40 degrees Celsius in an atmosphere of nitrogen for eight hours. Subsequently, to each of the liquids obtained in the above-mentioned manner, 2 g of toluene was added and stirred, and 10 g of methanol was added thereto. After confirming this became cloudy, this was subjected to acceleration of 1500 G for 30 minutes by the centrifugal so as to precipitate the semiconductor ultrafine particles. Thereafter, toluene and methanol solution in the supernatant liquid were removed by a dropping pipet. This operation was repeated three times to remove excess modified silicone, thereby obtaining semiconductor ultrafine particles (a fluorescent substance) coated with amino group substitution modified silicone. The state of coating with the modified silicone was confirmed by Fourier transform infrared spectrometry and further by X-ray photoelectron spectrometry. The fluorescent wavelengths (emission characteristics) of the semiconductor ultrafine particles synthesized in the above manner are presented in Table 1.

<Measurement of Quantum Efficiency>

Reference material (rhodamine B) having the known quantum efficiency was prepared. The quantum efficiency of the obtained fluorescent substance was measured by relative comparison with the reference material.

<Method of Measuring Quantum Efficiency>

(1) The fluorescent substance and the reference material were dissolved in toluene. At this time, the concentrations of their respective solutions were adjusted so as to have an absorbance of 0.2 at the emission wavelength of the light emitting diode (395 nm in wavelength).

(2) The adjusted solutions were separately diluted ten times with toluene, and their respective emission characteristics were measured on a fluorophotometer manufactured by Shimadzu Corp. An excitation wavelength of 395 nm was used.

(3) Their respective fluorescence spectrum areas were found and used to find the quantum efficiency of the fluorescent substance from the following formula:

$$A = \frac{B}{C} \times D$$

where A is the quantum efficiency of a fluorescent substance; B is the fluorescence spectrum area of the fluorescent substance; C is the florescence spectrum area of a reference material; and D is the quantum efficiency of the reference material (rhodamine B).

The results are presented in Table 1.

TABLE 1

| Examples Nos. | Ratio of Blending (Mole ratio) | Reaction Temperature (° C.) | Reaction Time (hr) | Fluorescent Wavelength (nm) | Mean Particle Diameter (nm) | Quantum Efficiency (%) |
|---|---|---|---|---|---|---|
| 1 | Ag:In:S = 1:1:4 | 430 | 5 | 450 | 2.0 | 84.3 |
| 2 | Zn:Ag:In:S = 1:1:1:4 | 160 | 10 | 490 | 2.1 | 72.4 |
| 3 | Zn:Ag:In:S = 1:2:1:4 | 160 | 10 | 504 | 2.3 | 77.6 |
| 4 | Zn:Ag:In:S = 1:3:1:4 | 160 | 10 | 514 | 2.3 | 75.6 |
| 5 | Zn:Ag:In:S = 1:3:1:4 | 200 | 10 | 541 | 2.7 | 76.6 |
| 6 | Zn:Ag:In:S = 1:5:1:4 | 160 | 10 | 530 | 2.5 | 78.2 |
| 7 | Zn:Ag:In:S = 1:5:1:4 | 200 | 10 | 552 | 2.8 | 76.3 |
| 8 | Zn:Ag:In:S = 1:7:1:4 | 160 | 10 | 539 | 2.7 | 76.6 |
| 9 | Zn:Ag:In:S = 1:7:1:4 | 200 | 10 | 555 | 2.8 | 73.4 |
| 10 | Zn:Ag:In:S = 1:10:1:4 | 160 | 10 | 546 | 2.7 | 78.7 |
| 11 | Zn:Ag:In:S = 1:10:1:4 | 200 | 10 | 563 | 3.0 | 74.5 |
| 12 | Zn:Ag:In:S = 1:15:1:4 | 200 | 10 | 625 | 3.2 | 71.6 |
| Comparative Example 1 | Cd:Se = 1:1 | 300 | 2 | 557 | 2.9 | 76.8 |

It will be noted from Table 1 that all of the fluorescent substances (Examples Nos. 1 to 12) obtained in the above manner exhibited a quantum efficiency of 70% or more.

<Mounting of Light Emitting Diode>

As a light emitting diode, one having a multi-quantum well structure was used in which, (i) an n type GaN layer being an undoped nitride semiconductor; (ii) a GaN layer with an Si doped n type electrode formed thereon so as to function as an n type contact layer; (iii) an n-type GaN layer being an undoped nitride semiconductor were layered on a light emitting diode substrate, and (iv) a GaN layer functioning as a barrier layer constituting a luminescent layer; (v) an InGaN layer constituting a well layer; and (vi) a GaN layer functioning as a barrier layer were regarded as a set, and the InGaN layer sandwiched between the GaN layers were stacked to form five layers. A substrate with a wiring pattern for arranging the light emitting diode formed thereover, and a frame-like reflector surrounding a near ultraviolet LED were mounted in a package to be formed. This light emitting diode was mounted on the wiring pattern in the package with Ag paste interposed therebetween.

<Manufacture of Internal Layer>

Subsequently, the package was filled with silicone resin so as to coat the light emitting diode, and the resin was cured to form an internal layer by further heating. The filling of the silicone resin was performed with the coating method by using a dispenser.

<Manufacture of Wavelength Converter>

In 100 parts by weight of silicone resin formed of a dimethyl silicone skeleton, 30 parts by weight of each of the fluorescent substances in Examples 1 to 12 and Comparative Example 1 were dispersed and mixed to manufacture resin pastes containing the fluorescent substances, respectively. Each of the obtained resin pastes containing the fluorescent substances was formed on a smooth substrate by coating with the dispenser. This was heated on a hot plate at 150 degrees Celsius for five minutes to manufacture a temporary cured film. This was further dried for five hours in a dryer set at 150 degrees Celsius, thereby manufacturing a film containing the fluorescent substance (a wavelength converter). Its thickness was 0.5 mm.

<Manufacture of Light Emitting Unit>

The light emitting unit as illustrated in FIG. 2 was obtained by attaching the above film containing the fluorescent substance to the upper surface of the internal layer. In the above film, that is, the obtained wavelength converter, the same silicone resin as in the internal layer was interposed therebetween, as adhesive.

<Luminous Efficiency Test>

The luminous efficiency of each of the light emitting units formed of the wavelength converter was measured on an emission characteristic evaluating device manufactured by OTSUKA ELECTRONICS, CO., LTD. In all of Examples 1 to 12, the lighting system exhibiting high luminous efficiency of 60 lm/W or more could be obtained.

What is claimed is:

1. A wavelength converter converting a wavelength of light emitted from a light source and outputting an output light containing light whose wavelength is converted, which comprises a fluorescent substance dispersed in a transparent matrix, wherein the fluorescent substance has semiconductor fine particles comprising a $Zn_\alpha Ag_\beta InS_\gamma$ compound ($\alpha$=0.1 to 1, $\beta$=0.1 to 1, and $\gamma$=2 to 4), and not substantially containing Cd and Se.

2. The wavelength converter according to claim 1, wherein the semiconductor fine particles have a mean particle diameter of 0.5 to 10 nm.

3. The wavelength converter according to claim 1, wherein the output light has a peak wavelength of 400 to 750 nm.

4. The wavelength converter according to claim 1, wherein the wavelength converter has a thickness of 0.1 to 5 mm.

5. A lighting system having, on a substrate, a light emitting diode comprising a compound semiconductor emitting excited light, and a wavelength converter converting a wavelength of the excited light, the wavelength converter being a wavelength converter according to claim 1.

6. The lighting system according to claim 5, wherein a band gap energy of at least part of semiconductor fine particles included in the fluorescent substance of the wavelength converter is smaller than an energy emitted from the light emitting diode.

7. A lighting system assembly comprising a plurality of lighting systems according to claim 5.

8. A wavelength converter converting a wavelength of light emitted from a light source and outputting an output light containing light whose wavelength is converted, which comprises a fluorescent substance dispersed in a transparent matrix, wherein the fluorescent substance has semiconductor fine particles containing Ag, an element of group III in the periodic table, and sulfur, and not substantially containing Cd and Se, and surfaces of the semiconductor fine particles are coated with a semiconductor material having a larger band gap than the semiconductor fine particles.

9. A lighting system having, on a substrate, a light emitting diode comprising a compound semiconductor emitting excited, light, and a wavelength converter converting a wavelength of the excited light, the wavelength converter being a wavelength converter according to claim 8.

10. A lighting system assembly comprising a plurality of lighting systems according to claim 9.

11. A wavelength converter converting a wavelength of light emitted from a light source and outputting an output light containing light whose wavelength is converted, which comprises a fluorescent substance dispersed in a transparent matrix, wherein the fluorescent substance has semiconductor fine particles containing Ag, an element of group III in the periodic table, and sulfur, and not substantially containing Cd and Se, and surfaces of the semiconductor fine particles are coated with surface modifying molecules comprising an organic compound.

12. The wavelength converter according to claim 11, wherein a semiconductor material having a larger band gap than the semiconductor fine particles, and surface modifying molecules comprising an organic compound are sequentially layered on surfaces of the semiconductor fine particles.

13. The wavelength converter according to claim 11, wherein the surface modifying molecules are molecules having repetitively two or more silicon-oxygen bondings.

14. A lighting system having, on a substrate, a light emitting diode comprising a compound semiconductor emitting excited light, and a wavelength converter converting a wavelength of the excited light, the wavelength converter being a wavelength converter according to claim 11.

15. A lighting system assembly comprising a plurality of lighting systems according to claim 14.

16. A wavelength converter converting a wavelength of light emitted from a light source and outputting an output light containing light whose wavelength is converted, which comprises a fluorescent substance dispersed in a transparent matrix, wherein the fluorescent substance has semiconductor fine particles containing Ag, an element of group III in the periodic table, and sulfur, and not substantially containing Cd and Se, and two or more types of fluorescent substances with the semiconductor fine particles having different mean particle diameters are dispersed.

17. A lighting system having, on a substrate, a light emitting diode comprising a compound semiconductor emitting excited light, and a wavelength converter converting a wavelength of the excited light, the wavelength converter being a wavelength converter according to claim 16.

18. A lighting system assembly comprising a plurality of lighting systems according to claim 17.

* * * * *